(12) United States Patent
Dictus

(10) Patent No.: US 7,824,499 B2
(45) Date of Patent: Nov. 2, 2010

(54) PHOTON INDUCED CLEANING OF A REACTION CHAMBER

(75) Inventor: Dries Dictus, Kessel-lo (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 293 days.

(21) Appl. No.: 12/147,900

(22) Filed: Jun. 27, 2008

(65) Prior Publication Data

US 2009/0173359 A1 Jul. 9, 2009

Related U.S. Application Data

(60) Provisional application No. 61/050,882, filed on May 6, 2008, provisional application No. 60/948,129, filed on Jul. 5, 2007, provisional application No. 60/970,844, filed on Sep. 7, 2007.

(30) Foreign Application Priority Data

Jun. 26, 2008 (EP) .................................. 08159125

(51) Int. Cl.
*B08B 7/00* (2006.01)
(52) U.S. Cl. .................. 134/1.1; 134/1.2; 438/905; 416/67
(58) Field of Classification Search .............. 134/1.1, 134/1.2, 1.3; 438/708, 709, 705; 216/67, 216/75, 78
See application file for complete search history.

(56) References Cited

U.S. PATENT DOCUMENTS 5,356,478 A * 10/1994 Chen et al. ................. 134/1

6,569,775 B1 * 5/2003 Loewenhardt et al. ...... 438/709
2006/0219267 A1 10/2006 Bailey et al.

FOREIGN PATENT DOCUMENTS

EP 1 338 674 A 8/2003

OTHER PUBLICATIONS

Lee, Sangheon. Hydrogen bromide plasma-copper reaction in a new copper etching process. Thin Solid Films 457 (2004) 326-332.

* cited by examiner

*Primary Examiner*—Michael Barr
*Assistant Examiner*—Saeed T Chaudhry
(74) *Attorney, Agent, or Firm*—Knobbe Martens Olson & Bear LLP

(57) ABSTRACT

The present invention provides a method for in-situ cleaning of walls of a reaction chamber, e.g. reactive ion etching chamber, to remove contamination, e.g. copper comprising contamination from the walls. The method comprises converting the contamination, e.g. copper comprising contamination into a halide compound, e.g. copper halide compound and exposing the halide compound, e.g. copper halide compound to a photon comprising ambient, thereby initiating formation of volatile halide products, e.g. volatile copper halide products. The method furthermore comprises removing the volatile halide products, e.g. volatile copper halide products from the reaction chamber to avoid saturation of the volatile halide products, e.g. volatile copper halide products in the reaction chamber in order to avoid re-deposition of the volatile halide products, e.g. volatile copper halide products to the walls of the reaction chamber.

11 Claims, 3 Drawing Sheets

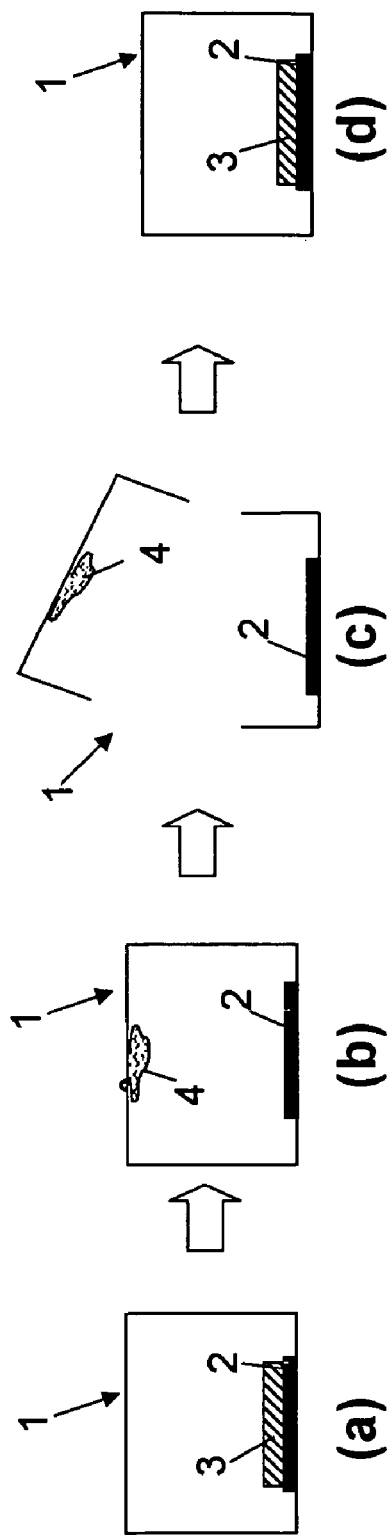
FIG. 1 – PRIOR ART
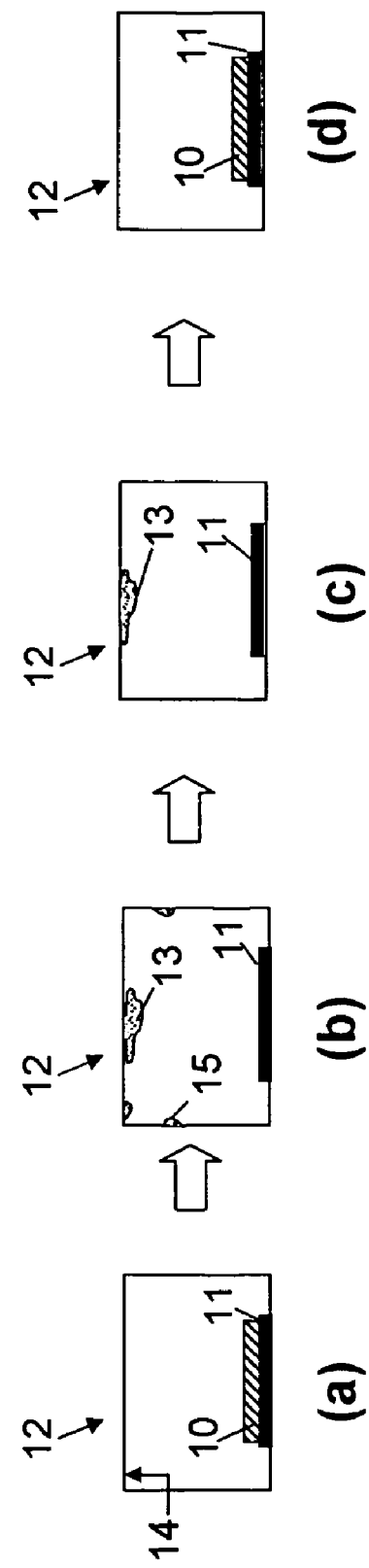
FIG. 2

US 7,824,499 B2

PHOTON INDUCED CLEANING OF A REACTION CHAMBER

CROSS-REFERENCE TO RELATED APPLICATIONS

This application claims the benefit under 35 U.S.C. §119(e) of U.S. Provisional Application No. 61/050,882 filed on May 6, 2008, U.S. Provisional Application No. 60/948,129 filed on Jul. 5, 2007, and U.S. Provisional Application No. 60/970,844 filed on Sep. 7, 2007 filed on May 6, 2008, the disclosures of which are hereby expressly incorporated by reference in their entirety and are hereby expressly made a portion of this application.

FIELD OF THE INVENTION

Methods for cleaning reaction chambers, e.g. reactive ion etching chambers, are provided. More particularly, a method for in-situ cleaning of walls of a reaction chamber, e.g. a reactive ion etching chamber, to remove contamination, e.g. copper comprising contamination, from the walls is provided.

BACKGROUND OF THE INVENTION

In the field of semiconductor processing, typically damascene processes are used to form copper-based interconnects. In damascene processes, trenches are etched in low dielectric constant materials and these trenches are then subsequently filled up to create the copper interconnects.

During performance of an etch process unwanted portions of a material layer deposited on a substrate may be removed, thereby forming a desired material layer pattern. In case of a damascene process, trenches and vias are etched in a dielectric material film. Typically a resist pattern is deposited first onto the dielectric layer and the dielectric layer is then selectively etched with respect to the resist pattern thereby, for example, using an anisotropic plasma formed in a reactive ion etching chamber. Therefore, a negative voltage is applied to an electrode which is located below the loaded wafer. In response to the negative voltage the positive ions in the plasma are pulled towards the wafer and are absorbed upon impact with the portions of dielectric film exposed through resist pattern. When absorbed, the ions chemically react with atoms in the dielectric layer under the influence of kinetic energy imparted by the applied electric field to form a volatile compound. In this manner, the plasma etching process selectively removes the exposed portion of a dielectric layer. The endpoint of the etching process is typically determined by over-etching in the Cu structure underneath. This over-etching leads to Cu contamination of the chamber walls of the reaction chamber because Cu is sputtered away and will re-deposit onto these chamber walls. Since Cu is unwanted in the dielectric material of a semiconductor device, the removal of these Cu residues from the chamber walls is extremely important. Since Cu is very difficult to volatilize, a state of the art cleaning process (e.g. Wafer Auto Clean (WAC) processes) is not sufficient because sputtering the Cu deposits will only lead to a re-deposition of the residues onto other parts of the reaction chamber. A chamber cleaning process used to clean the reaction chamber in order to remove most of the copper nowadays often consists of dismantling the chamber and performing a wet etch with citric acid.

FIG. 1 schematically illustrates such a state of the art chamber cleaning procedure used to remove copper residues in e.g. a reactive ion etching chamber. FIG. 1(a) illustrates the plasma chamber 1 with a wafer holder 2, also referred to as wafer chuck, and a wafer 3 located on the wafer chuck 2 and used as a substrate onto which plasma processing is performed. Performance of the plasma process leads to copper residues 4 sticking onto the chamber walls. A prior art WAC cleaning (e.g. using a plasma of $O_2/SF_6$ or an $O_2/Cl_2$ plasma) may be performed to remove contaminants mainly consisting of organic polymeric residues. However, after performing such a WAC cleaning, the copper residues 4 will still be present on the chamber walls (see FIG. 1(b)). According to prior art methods a wet cleaning procedure using e.g. citric acid is required to remove the copper contamination 4. Such wet etch requires the dismantling of the plasma chamber 1 which is very time consuming (see FIG. 1(c)). Moreover, after each cleaning process, stabilization of the plasma chamber is required (see FIG. 1(d)) before another wafer process can be started.

The above-described cleaning procedure is thus time consuming and cannot be performed after each wafer which implies that Cu contamination is hardly impossible to be avoided during processing, because that would take even more time.

SUMMARY OF THE INVENTION

It is an object of preferred embodiments to provide a method for in-situ cleaning of walls of a reaction chamber to remove contamination from the chamber walls.

The contamination may be copper comprising contamination. The contamination may be formed by residues originating from plasma based processes performed in the reaction chamber, such as e.g. reactive ion etching, and may, for example, be copper comprising residues.

The above objective is accomplished by a method according to preferred embodiments.

A method according to preferred embodiments allows removal of contamination from reaction chamber walls by using photon induced reactions.

In one aspect, a method is provided for in-situ cleaning of walls of a reaction chamber, e.g. reactive ion etching chamber, to remove contamination from the walls. The method comprises:

converting the contamination into a halide compound, e.g. a halide compound different from a fluoride compound, exposing the halide compound, e.g. a halide compound different from a fluoride compound, to a photon comprising ambient, thereby initiating formation of volatile halide products, and removing the volatile halide products from the reaction chamber to avoid saturation of the volatile halide products in the reaction chamber and hence to avoid re-deposition of the volatile halide product onto the walls of the reaction chamber.

It is an advantage that a method according to preferred embodiments provides a fast, quickly and easily applicable cleaning method which removes the contamination, e.g. copper comprising contamination, from walls of a reaction chamber without the need to dismantle the reaction chamber.

In another aspect, a method is provided for in-situ cleaning of walls of a reaction chamber, e.g. reactive ion etching chamber, to remove copper comprising contamination from the walls. The method comprises:

converting the copper comprising contamination into a copper halide compound, e.g. a copper halide compound different from a copper fluoride compound, and exposing the copper halide compound, e.g. a copper halide compound different from a copper fluoride compound, to a photon comprising ambient thereby initiating formation of volatile copper halide products, and removing the volatilized copper halide products from the reaction chamber to avoid saturation of the volatilized copper halide products in the reaction chamber and hence avoid re-deposition of the volatile copper halide products onto the walls of the reaction chamber.

It is an advantage that a method according to preferred embodiments provides a fast, quickly and easily applicable cleaning method which removes the contamination, e.g. copper comprising contamination, from walls of a reaction chamber without the need to dismantle the reaction chamber.

According preferred embodiments converting the contamination, e.g. copper comprising contamination into a halide compound, e.g. copper halide compound and exposing the halide compound, e.g. copper halide compound to a photon comprising ambient may be performed simultaneously. In that case, a plasma comprising at least a halogen compound and a photon inducing compound e.g. originating from a He, Ar or H plasma may be provided in the reaction chamber.

According to other preferred embodiments converting the contamination, e.g. copper comprising contamination into a halide compound, e.g. copper halide compound and exposing the halide compound, e.g. copper halide compound to a photon comprising ambient may be performed subsequently. In a first step the contamination, e.g. copper comprising contamination may be converted into a halide compound, e.g. copper halide compound and in a second step the halide compound, e.g. copper halide compound may be exposed to a photon comprising ambient so as to initiate formation of volatile halide products, e.g. volatile copper halide products. According to preferred embodiments, the individual steps may be repeated until a desired level of cleaning is obtained.

According to preferred embodiments, converting the contamination, e.g. copper comprising contamination into a halide compound, e.g. copper halide compound may be performed by exposing the contamination, e.g. copper comprising contamination to a halogen comprising gas such as, for example, a $BCl_3$, HBr, $Br_2$, $Cl_2$, $I_2$, HCl and/or HI gas.

According to other embodiments, converting at least part of the contamination, e.g. copper comprising contamination into a halide compound, e.g. copper halide compound may be performed by exposing the contamination, e.g. copper comprising contamination, to a halogen comprising plasma. The halogen comprising plasma may be a Br, I and/or Cl comprising plasma which is formed using (or in other words starting from) $BCl_3$, HBr, $Br_2$, $Cl_2$, $I_2$, HCl and/or HI gasses. The halogen comprising plasma may, for example, be formed in a reactive ion etching chamber using $BCl_3$, HBr, $Br_2$, $Cl_2$, $I_2$, HCl and/or HI gasses.

Exposing the contamination, e.g. copper comprising contamination to a halogen comprising plasma may be performed with a halogen comprising plasma at a power of between 200 Watt and 1000 Watt, a pressure of between 4 mTorr (0.53 Pa) and 80 mTorr (10.67 Pa) and a flow rate (incoming) of between 50 sccm and 500 sccm. As an example, a plasma at a power of 600 Watt and a pressure of 10 mTorr may be used. The conditions of the halogen plasma are not critical to perform the method according to preferred embodiments. In fact all conditions are suitable as long as the contamination, e.g. copper comprising contamination is converted into a halide compound, e.g. copper halide compound.

In case the copper contamination is an oxidized copper compound (e.g. CuO), the preferred gas (plasma) used to perform the step of converting the copper contamination into a copper halide compound is a $BCl_3$ comprising gas or plasma because $BCl_3$ has the advantage to reduce the oxidized copper and subsequently convert it into a halogenated copper compound more easily.

Exposing the halide compound, e.g. copper halide compound to a photon comprising ambient may be performed by exposing the halide compound, e.g. copper halide compound to a He, Ar or H comprising plasma. The partial pressure of the volatile halide products, e.g. volatile copper halide products must be such that no saturation is reached. The intensity of plasma to initiate formation of volatile halide products, e.g. volatile copper halide products from the surface is preferably in the $mW/cm^2$ range. The intensity of the plasma can be tuned by the applied power and pressure. Formation of volatile halide products, e.g. volatile copper halide products is already possible using a He, Ar or H comprising plasma having a power of between 300 Watt and 1000 Watt and a pressure of between 4 mTorr (0.53 Pa) and 80 mTorr (10.67 Pa). The conditions of the plasma such as pressure, flow rate and exposure time are strongly inter-related (e.g. higher pressure may result in shorter exposure time).

According to preferred embodiments, the halide compound may be a copper halide compound comprising $Cu_xCl_y$, and the photon comprising ambient may be a He plasma, and exposing the copper halide compound to the photon comprising ambient may be performed at a power of 1000 Watt and a pressure of 30 mTorr (4 Pa). The exposure time is dependent on the amount of copper contamination to be removed. Alternatively the procedure may be repeated until all contamination is removed from the walls of the reaction chamber.

According to preferred embodiments, the halide compound may be a copper halide compound comprising $Cu_xBr_y$, and the photon comprising ambient may be a He plasma, and exposing the copper halide compound to the photon comprising ambient may be performed at a power of 1000 Watt and a pressure of 80 mTorr (10.67 Pa). The exposure time is dependent on the amount of copper contamination to be removed. Alternatively the procedure may be repeated until all contamination is removed from the walls of the reaction chamber.

It is an advantage of a method according to preferred embodiments that it does not require high temperatures to remove the contamination, e.g. the copper comprising contamination, from the walls of the reaction chamber, or in other words to form a halide compound, e.g. volatile copper halide compound. A method according to preferred embodiments may be performed at a temperature between 20° C. and 80° C. The photon induced cleaning step of a method according to preferred embodiments may be performed at room temperature. In other words, contamination, e.g. copper comprising contamination may be removed from walls of a reaction chamber at low temperatures, e.g. at room temperature.

According to preferred embodiments, the method may furthermore comprise, before applying the photon induced cleaning procedure to clean the reaction chamber the step of introducing a wafer into the reaction chamber to protect the wafer holder. This wafer may be used to measure the contamination in the chamber by TXRF (total reflection X-ray fluorescence).

According to preferred embodiments, the photon induced cleaning procedure may be applied each time a process has been applied to a wafer or may, alternatively and dependent on the degree of contamination, be performed after each batch of processed wafers or after a certain period of time.

According to preferred embodiments, the efficiency of the photon induced chamber cleaning or the time needed to remove all the contamination, e.g. copper comprising contamination may be monitored by Optical Emission Spectroscopy (OES). Such an OES system is commonly installed within a reaction chamber.

The method according to preferred embodiments may be used after a Waferless Auto cleaning procedure or another state of the art cleaning procedure has been performed.

Particular and preferred aspects of preferred embodiments are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages preferred embodiments will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

All figures are intended to illustrate some aspects and preferred embodiments. The figures are depicted in a simplified way for reason of clarity. Not all alternatives and options are shown and therefore not limited to the content of the given drawings.

FIG. 1 schematically illustrates a prior art chamber cleaning procedure.

FIG. 2 illustrates subsequent steps in a method according to preferred embodiments.

Figure 3:
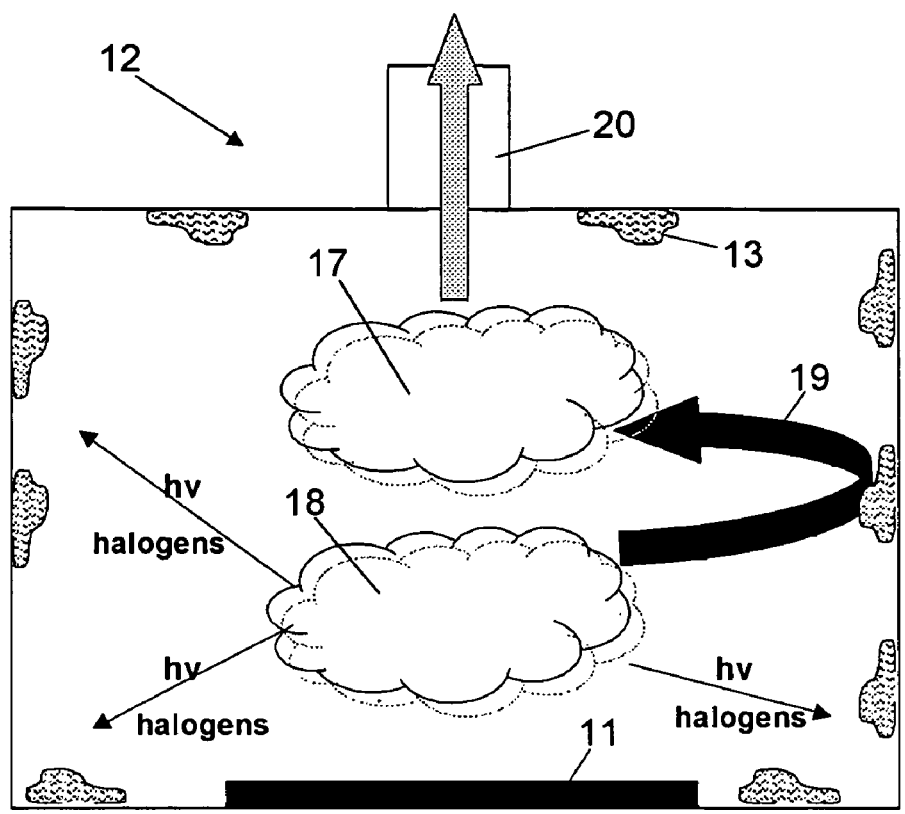
FIG. 3 illustrates photon induced chamber cleaning of a reaction chamber according to preferred embodiments.

In the different figures, the same reference signs refer to the same or analogous elements.

DETAILED DESCRIPTION OF THE PREFERRED EMBODIMENT

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the term top and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary preferred embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

Preferred embodiments will now be described by a detailed description of several preferred embodiments. It is clear that other embodiments can be configured according to the knowledge of persons skilled in the art without departing from the true spirit or technical teaching of preferred embodiments, the invention being limited only by the terms of the appended claims.

According to preferred embodiments a method is provided for in-situ cleaning of walls of a reaction chamber, e.g. a reactive ion etching chamber, to remove contamination from the walls. The method comprises:

converting the contamination into a halide compound, e.g. a halide compound different from a fluoride compound, exposing the halide compound, e.g. a halide compound different from a fluoride compound, to a photon comprising ambient, thereby initiating formation of volatile halide products, and removing the volatile halide products from the reaction chamber to avoid saturation of the volatile halide products in the reaction chamber so as to prevent re-deposition of the volatile halide products to the walls of the reaction chamber.

The contamination may be formed by residues originating from plasma based processes performed in the reaction chamber, such as e.g. reactive ion etching, and may, for example, be copper comprising residues.

In a specific preferred embodiment, the contamination may be copper comprising contamination. In that case, the preferred embodiment provides a method for in-situ cleaning of walls of a reaction chamber, e.g. a reactive ion etching chamber, to remove copper comprising contamination from the walls. The method comprises:

converting the copper comprising contamination into a copper halide compound, e.g. a copper halide compound different from a copper fluoride compound, and exposing the copper halide compound, e.g. a copper halide compound different from a copper fluoride compound to a photon comprising ambient to initiate formation a volatile copper halide compound, and removing the volatile copper halide products from the reaction chamber to avoid saturation of the volatile copper halide products in the reaction chamber so as to prevent re-deposition of the volatile copper halide products to the walls of the reaction chamber.

A method according to the preferred embodiments solves the problem of prior art cleaning procedures such as e.g. Waferless Autoclean procedures making use of $O_2/SF_6$ or $O_2/Cl_2$ plasmas, which only get rid of contaminants mainly comprising organic polymeric residues but not contamination such as copper comprising contamination. The problem associated with copper contamination is the fact that copper has a very high sublimation temperature of approximately 200° C. which makes it very difficult to remove it from the chamber walls, or in other words to make it volatile. One possibility to solve this problem is to heat the chamber walls to a very high temperature in combination with an ion sputtering process. However this option inevitable leads to redeposition of contaminants, e.g. copper to the chamber walls. Furthermore, this may also lead to chamber damage. Therefore wet etch procedures making use of e.g. citric acid may be used in the prior art to dissolve the copper contamination. However, the wet etch procedure is very time consuming and requires the dismantling of the reaction chamber.

The method according to preferred embodiments may nevertheless be used in combination with the above described WAC cleaning. According to these embodiments, first WAC cleaning may be performed to remove contaminants mainly comprising organic polymeric residues from the chamber walls. Subsequently, a method according to preferred embodiments may be used to remove contamination such as copper comprising contamination from the chamber walls.

An advantage of a method according to preferred embodiments is that it does not require the use of high temperatures to remove the contamination, e.g. copper comprising contamination for the walls of the reaction chamber. A method according to preferred embodiments may be performed at a temperature between 20° C. and 80° C. The photon induced cleaning step of a method according to preferred embodiments may be performed at room temperature.

The preferred embodiments will further be described by means of the contamination being copper comprising contamination. It has to be understood that this is only for the ease of explanation and that this is not intended to limit the invention in any way. The method according to preferred embodiments may be used for removing any kind of contamination that may be present in a reaction chamber, as long as it can form a halide compound when, for example, being exposed to a halogen comprising gas or plasma.

Throughout the description and the claims, with copper comprising contamination is meant contamination or residues sticking onto the surface of a reaction chamber. These residues may, for example, originate from reactive ion etching of a dielectric layer which is over-etched into the metallic structure, e.g. copper structure, underneath. In case of copper comprising contamination, this contamination may be in the form of, but not limited to, pure Cu, CuO or $Cu_xCl_y$.

According to preferred embodiments, converting the copper comprising contamination into a copper halide compound and exposing the copper halide compound to a photon comprising ambient to initiate formation of volatile copper halide products may be performed simultaneously. The simultaneous reaction may, for example, be performed using a plasma which comprises at least a halogen compound to perform the conversion of copper into a copper halide compound and a photon inducing compound e.g. originating from a He, Ar or $H_2$ plasma to form volatile copper halide products.

FIG. 2 schematically illustrates photon induced chamber cleaning according to preferred embodiments to remove copper comprising contamination 13 from walls 14 of a reaction chamber 12.

A wafer 10 is provided on a chuck 11 in a reaction chamber 12 (see FIG. 2(a)). After the wafer 10 has been processed, e.g. etched by means of reactive ion etching, copper comprising contamination 13, in the example given etching residues, are present on walls 14 of the reaction chamber 12 (see FIG. 2(b)). Depending on the process, e.g. plasma process that has been performed, also other contamination 15, such as e.g. organic polymer residues, may be present at the chamber walls 14. For removing the contamination 15 different from copper contamination 13, first WAC cleaning e.g. using a plasma of $O_2/SF_6$ or an $O_2/Cl_2$ plasma may be performed (see FIG. 2(c)). The WAC cleaning will remove the contaminants 15 mainly consisting of organic polymeric residues; the copper comprising residues 13 will not be removed when using this cleaning step. Hence, after the WAC cleaning, there is still copper comprising contamination 13 present at the chamber walls 14 (see FIG. 2(c)).

For removing the copper comprising contamination from the chamber walls 14 a method according to preferred embodiments may be used, leading to clean chamber walls as illustrated in FIG. 2(d). In the example given in FIG. 2, converting the copper comprising contamination 13 into a copper halide compound and exposing the copper halide compound to a photon comprising ambient to make the copper halide compound volatile may be performed simultaneously. This is illustrated in FIG. 3.

FIG. 3 illustrates a plasma chamber 12 in which the conversion of the copper comprising contamination and the exposure to a photon induced ambient are performed simultaneously. According to the present embodiments, the copper comprising residues 13 are simultaneously exposed to a plasma 16 comprising halogens (e.g. originating from a Cl, Br and/or I plasma) and photons (e.g. originating from a He plasma). By exposing the copper comprising residues 13 to the halogens, these copper comprising residues 13 are converted into copper halide compounds which are then volatilised by exposure to the photons, to thereby form volatile copper halide products 17. According to preferred embodiments, the copper halide compounds may, for example, comprise $Cu_xCl_y$, $Cu_xBr_y$ and/or $Cu_xI_y$.

According to preferred embodiments, converting the copper comprising contamination into a copper halide compound may be performed by exposing the copper comprising contamination to a halogen comprising gas such as, for example, a $BCl_3$, HBr, $Br_2$, $Cl_2$, $I_2$, HCl and/or HI comprising gas.

According to other preferred embodiments, converting the copper comprising contamination into a copper halide compound may be performed by exposing the copper comprising contamination to a halogen comprising plasma. The halogen comprising plasma may be formed in a reactive ion etching chamber using $BCl_3$, HBr, $Br_2$, $Cl_2$, $I_2$, HCl and/or HI gasses.

Exposing the copper contamination to a halogen comprising plasma may be performed with a halogen comprising plasma (e.g. using $Cl_2$, $Br_2$, HCl, HBr, $BCl_3/Cl_2$, HI, or the like) at a power of between 200 Watt and 1000 Watt, a pressure of between 4 mTorr (0.53 Pa) and 80 mTorr (10.67 Pa) and a flow rate (incoming) of between 50 sccm and 500 sccm. For example, a plasma at a power of 600 Watt and a pressure of 10 mTorr (1.33 Pa) may be used.

According to a specific example, the copper halide compound may comprise $Cu_xCl_y$ and the photon comprising ambient may be a He plasma. According to this example, exposing the copper halide compound to the photon comprising ambient may be performed by using a plasma at a power of 1000 Watt and a pressure of 4 Pa.

According to another specific example, the copper halide compound may comprise $Cu_xBr_y$ and the photon comprising ambient may a He plasma. According to these examples, exposing the copper halide compound to the photon comprising ambient may be performed by using a plasma at a power of 1000 Watt and a pressure of 10.67 Pa.

During and/or after exposure of the copper halide compounds to the photon comprising ambient, the volatile copper halide products 17 may be removed from the reaction chamber 12. Removal of the volatile copper halide products 17 is to avoid saturation of these volatile copper halide products 17 in the reaction chamber 12. By removing, also referred to as refreshing, the ambient from the reaction chamber 12, saturation of the copper halide products 17 in the reaction chamber 12 is avoided such that re-deposition of these copper halide products 17 onto the chamber walls 14 is prevented.

In preferred embodiments, removal of the volatile copper halide products 17 from the reaction chamber 12 is such that no saturation levels are reached, as in that case the volatile copper halide products 17 can be re-deposited onto the chamber walls 14, which has to be avoided. The maximum allowable concentration of the volatile copper halide products 17 in the reaction chamber 12 can be derived from the following equation:

$$S = \frac{P_a}{P_e} \quad [1]$$

in which S is the saturation ratio of the gas phase in the reaction chamber 12, $P_a$ is the real partial pressure of the volatile copper halide products 17 in the reaction chamber 12 and $P_e$ the theoretical equilibrium partial pressure of volatile copper halide products 17 at a given pressure and temperature.

The partial pressure of the volatile copper halide products 17 in the reaction chamber 12 can be influenced by the incoming gas flow(s) in the reaction chamber 12 (e.g. He gas flow). The following equation [2] describes the relationship of the incoming gas flow on the actual concentration of gasses in the reaction chamber 12 at a given pressure and temperature:

$$D = D_0 \frac{T}{T_0} \frac{P_0}{P} \quad [2]$$

in which $D_0$, $T_0$, $P_0$ are respectively the gas flow, temperature (25° C.) and pressure (1 atm) of the incoming gas (He) and D, T en P the actual flow, temperature and pressure in the reaction chamber 12.

Since, according to preferred embodiments, the method may be performed at low temperatures, the removal of the volatile copper halide products 17 out of the reaction chamber 12 may be an important step. This requires in general that the incoming gas flow rate is correlated to the exhaust flow rate. For example, the incoming gas flow for He may be e.g. higher than 250 sccm at the standard operation pressure (5 mTorr (0.67 Pa) up to 80 mTorr (10.67 Pa)). According to preferred embodiments, the volatile copper halide products 17 may be removed from the reaction chamber 12 through the exhaust.

FIG. 2(d) shows the reaction chamber 12 after performance of the method according to preferred embodiments and ready to be used for processing another wafer 10. The copper contamination 13 is substantially completely removed and because only standard plasma processes have been used the stabilization of the plasma chamber to continue the plasma processing is reduced to a minimum.

Figure 4:
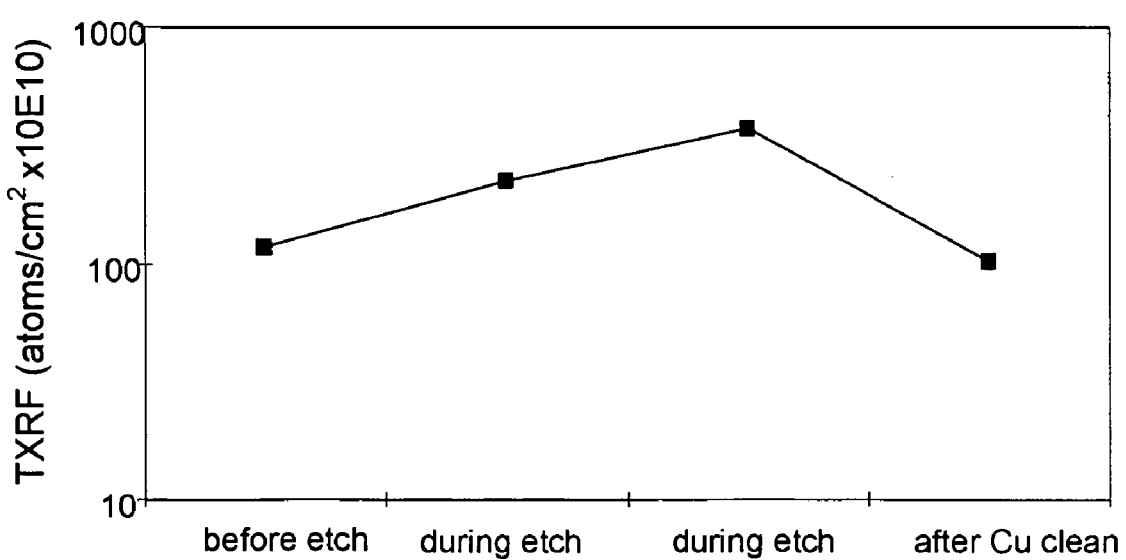
FIG. 4 shows a TXRF diagram illustrating copper contamination during a plasma process performed in a reaction chamber and after cleaning the reaction chamber using a method according to preferred embodiments.

FIG. 4 illustrates the process as described above in terms of the contamination present for a Si wafer which is introduced into the reaction chamber 12 and which is then subjected to a copper etch (reference value). The figure furthermore shows values for the contamination after etching and after performing a photon induced chamber cleaning using a method according to preferred embodiments to remove the copper contamination origination from the copper etching from the chamber walls 14. The contamination as illustrated in FIG. 4 was analysed using Total reflection X-ray Fluorescence (TXRF).

According to other preferred embodiments converting the copper comprising contamination 13 into a copper halide compound and exposing the copper halide compound to a photon comprising ambient may be performed subsequently. According to these embodiments, in a first step the copper comprising contamination 13 is converted into a copper halide compound and in a second step the copper halide compound is exposed to the photon comprising ambient to volatilize the copper halide compound so as to form volatile copper halide products 17. According to preferred embodiments, these individual steps can be repeated as many times as required until a desired level of cleaning is obtained.

Figure 5:
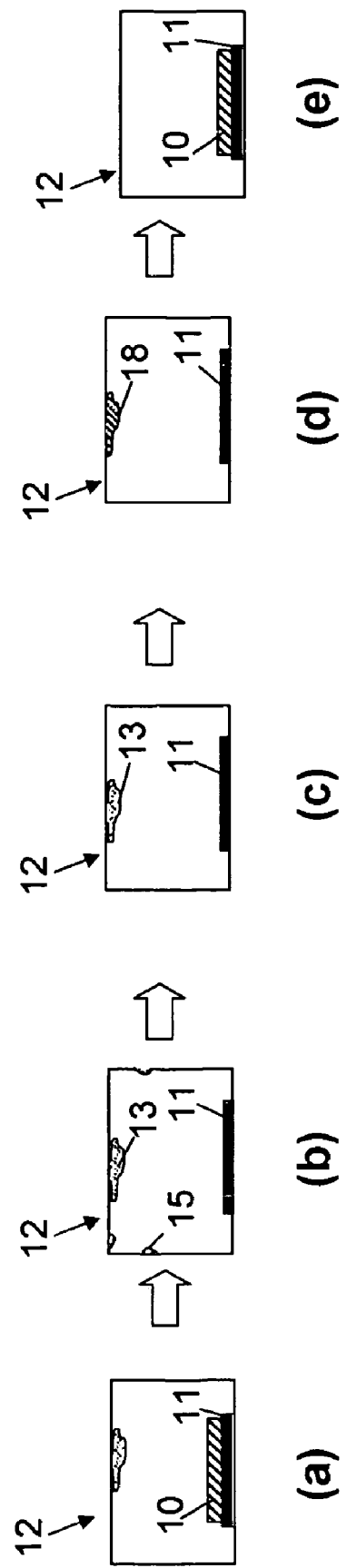
FIG. 5 illustrates subsequent steps in a method according to preferred embodiments.

FIG. 5 schematically illustrates photon induced chamber cleaning according to such embodiments to remove copper comprising contamination 13 whereby the converting the copper comprising contamination 13 into a copper halide compound and exposing the copper halide compound to a photon comprising ambient to make the copper halide compound volatile are performed in two individual but successive steps.

FIG. 5(a) shows a reaction chamber 12 comprising a wafer 10 located on a chuck 11. After processing, e.g. reactive ion etching of the wafer 10, copper comprising contamination 13 is present at the chamber walls 14. Also, depending on the process that has been performed, other contamination such as polymer comprising residues 15 may be present on the chamber walls 14 (see FIG. 5(b)). As described earlier, first a WAC cleaning step e.g. using a plasma of $O_2/SF_6$ or an $O_2/Cl_2$ plasma, may be performed to remove the polymer comprising residues 15 from the chamber walls 14. After performing the WAC cleaning step, the polymer comprising residues 15 are removed from the chamber walls 14 but the copper comprising contamination 13 is still there (see FIG. 5(c)).

The copper comprising contamination 13 may then, according to the present embodiments, be removed by first converting it into a copper halide compound 18 by exposure to a halogen comprising plasma (see FIG. 5(d)). According to preferred embodiments, converting the copper comprising contamination into a copper halide compound may be performed by exposing the copper comprising contamination to a halogen comprising gas such as, for example, a $BCl_3$, HBr, $Br_2$, $Cl_2$, $I_2$, HCl and/or HI comprising gas.

According to other preferred embodiments, converting the copper comprising contamination into a copper halide compound may be performed by exposing the copper comprising contamination to a halogen comprising plasma. The halogen comprising plasma may be formed in a reactive ion etching chamber using $BCl_3$, HBr, $Br_2$, $Cl_2$, $I_2$, HCl and/or HI gasses.

Exposing the copper contamination to a halogen comprising plasma may be performed with a halogen comprising plasma (e.g. using $Cl_2$, $Br_2$, HCl, HBr, $BCl_3/Cl_2$, HI, . . . ) at a power of between 200 Watt and 1000 Watt, a pressure of between 4 mTorr (0.53 Pa) and 80 mTorr (10.67 Pa) and a flow rate (incoming) of between 50 sccm and 500 sccm. For example, a plasma at a power of 600 Watt and a pressure of 10 mTorr (1.33 Pa) may be used.

Subsequently, the formed copper halide compound 18 may then be volatilised by exposure to a photon comprising ambient. The photon comprising ambient may, fore example, be a He, Ar or H comprising plasma.

According to a specific example, the copper halide compound 18 may comprise $Cu_xCl_y$ and the photon comprising ambient may be a He plasma. According to this example, exposing the copper halide compound 18 to the photon comprising ambient may be performed by using a plasma at a power of 1000 Watt and a pressure of 4 Pa.

According to another specific example, the copper halide compound 18 may comprise $Cu_xBr_y$ and the photon comprising ambient may a He plasma. According to these examples, exposing the copper halide compound 18 to the photon comprising ambient may be performed by using a plasma at a power of 1000 Watt and a pressure of 10.67 Pa.

During and/or after exposure of the copper halide compounds to the photon comprising ambient, the volatile copper halide products 17 are removed from the reaction chamber 12. Removal of the volatile copper halide products 17 is to avoid saturation of these volatile copper halide products 17 in the reaction chamber 12. By removing, also referred to as refreshing, the ambient from the reaction chamber 12, saturation of the copper halide products 17 in the reaction chamber 12 is avoided such that re-deposition of these copper halide products 17 onto the chamber walls 14 is prevented.

Since, according to preferred embodiments, the method may performed at low temperatures, the removal of the volatile copper halide products 17 out of the reaction chamber 12 may be an important step. This requires in general that the incoming gas flow rate is correlated to the exhaust flow rate. For example, the incoming gas flow for He may be e.g. higher than 250 sccm at the standard operation pressure (5 mTorr (0.67 Pa) up to 80 mTorr (10.67 Pa)). According to preferred embodiments, the volatile copper halide products 17 may be removed from the reaction chamber 12 through the exhaust.

FIG. 5(e) shows the reaction chamber 12 after performance of the method according to preferred embodiments and ready to be used for processing another wafer 10. The copper contamination 13 is substantially completely removed and because only standard plasma processes have been used the stabilization of the reaction chamber 12 to continue the plasma processing is reduced to a minimum.

It is to be understood that although preferred embodiments, specific constructions and configurations, as well as materials, have been discussed herein for devices according to the present invention, various changes or modifications in form and detail may be made without departing from the scope of this invention as defined by the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the preferred embodiments. At the very least, and not as an attempt to limit the application of the doctrine of equivalents to the scope of the claims, each numerical parameter should be construed in light of the number of significant digits and ordinary rounding approaches.

What is claimed is:

1. A method for in-situ cleaning of walls of a reaction chamber to remove contamination from the walls, the method comprising:
   converting contamination into a halide compound;
   exposing the halide compound to a photon-comprising ambient by exposing the halide compound to a plasma comprising at least one gas selected from the group consisting of He, Ar, and H, thereby initiating formation of volatile halide products; and
   removing the volatile halide products from the reaction chamber to avoid saturation of the volatile halide products in the reaction chamber.

2. The method of claim 1, wherein converting the contamination into a halide compound is performed by exposing the contamination to a gas comprising halogen.

3. The method of claim 1, wherein converting the contamination into a halide compound is performed by exposing the contamination to a plasma comprising halogen.

4. The method of claim 3, wherein exposing the contamination to a plasma comprising halogen is performed by exposing the contamination to a plasma with a power of from about 200 Watt to about 1000 Watt, a pressure of from about 0.53 Pa to about 10.67 Pa and a flow rate of from about 50 sccm to about 500 sccm.

5. The method of claim 2, wherein the halogen comprises at least one gas selected from the group consisting of $BCl_3/Cl_2$, HBr, $I_2$, HCl, HI, $Br_2$, and $Cl_2$.

6. The method of claim 3, wherein the halogen comprises at least one gas selected from the group consisting of $BCl_3/Cl_2$, HBr, $I_2$, HCl, HI, $Br_2$, and $Cl_2$.

7. The method of claim 1, wherein converting the contamination into a halide compound and exposing the halide compound to a photon-comprising ambient are performed simultaneously.

8. The method of claim 1, wherein converting the contamination into a halide compound and exposing the halide compound to a photon-comprising ambient are performed sequentially.

9. The method of claim 1, wherein the contamination comprise copper and wherein the halide compound is a copper halide compound.

10. The method of claim 9, wherein the copper halide compound comprises $CuCl_x$ and the photon-comprising ambient is a He plasma, and wherein exposing the copper halide compound to the photon-comprising ambient is performed at a power of about 1000 Watt and a pressure of about 4 Pa.

11. The method of claim 9, wherein the copper halide compound comprises $CuBr_x$ and the photon comprising ambient is a He plasma, and wherein exposing the copper halide compound to the photon comprising ambient is performed at a power of about 1000 Watt and a pressure of about 10.67 Pa.

* * * * *